(12) United States Patent
Wallace et al.

(10) Patent No.: US 8,724,309 B2
(45) Date of Patent: May 13, 2014

(54) HANDLE ASSEMBLY CONFIGURED FOR AIRFLOW

(75) Inventors: Brian William Wallace, Raleigh, NC (US); John David Swansey, Durham, NC (US); Robert Paul Tennant, Raleigh, NC (US)

(73) Assignee: Lenovo (Singapore) Pte. Ltd., Singapore (SG)

( * ) Notice: Subject to any disclaimer, the term of this patent is extended or adjusted under 35 U.S.C. 154(b) by 343 days.

(21) Appl. No.: 13/049,125

(22) Filed: Mar. 16, 2011

(65) Prior Publication Data

US 2012/0236487 A1 Sep. 20, 2012

(51) Int. Cl.
*G06F 1/16* (2006.01)
*H05K 5/00* (2006.01)
*H05K 7/00* (2006.01)

(52) U.S. Cl.
USPC .................................................. 361/679.37

(58) Field of Classification Search
USPC .................. 361/679.33–679.39, 679.49, 690, 361/714–716, 724–727
See application file for complete search history.

(56) References Cited

U.S. PATENT DOCUMENTS

| | | | | |
|---|---|---|---|---|
| 5,440,450 A | * | 8/1995 | Lau et al. | 361/695 |
| 5,654,873 A | * | 8/1997 | Smithson et al. | 361/679.37 |
| 6,018,125 A | * | 1/2000 | Collins et al. | 174/383 |
| 6,064,569 A | * | 5/2000 | Sands et al. | 361/679.32 |
| 6,233,143 B1 | * | 5/2001 | Gamble et al. | 361/679.34 |
| 6,273,186 B1 | * | 8/2001 | Ognibene et al. | 165/185 |
| 6,299,266 B1 | * | 10/2001 | Justice et al. | 312/223.2 |
| 6,424,526 B1 | * | 7/2002 | Heard | 361/679.47 |
| 6,454,646 B1 | * | 9/2002 | Helgenberg et al. | 454/184 |
| 6,565,163 B2 | | 5/2003 | Behl et al. | |
| 6,603,657 B2 | | 8/2003 | Tanzer et al. | |
| 6,636,422 B1 | * | 10/2003 | Tanzer et al. | 361/679.46 |
| 6,661,651 B1 | * | 12/2003 | Tanzer et al. | 361/679.33 |
| 6,819,555 B2 | * | 11/2004 | Bolognia et al. | 361/679.33 |
| 6,826,056 B2 | * | 11/2004 | Tsuyuki et al. | 361/725 |
| 6,876,547 B2 | * | 4/2005 | McAlister | 361/679.33 |
| 6,952,341 B2 | | 10/2005 | Hidaka et al. | |
| D514,109 S | * | 1/2006 | McClelland et al. | D14/439 |
| D544,866 S | * | 6/2007 | Wang et al. | D14/438 |
| 7,269,006 B2 | * | 9/2007 | Miyamoto et al. | 361/679.48 |
| 7,321,489 B2 | * | 1/2008 | McAlister | 361/679.33 |
| D568,887 S | * | 5/2008 | Wang | D14/446 |
| D577,719 S | * | 9/2008 | Kobeli et al. | D14/300 |
| 7,599,176 B1 | * | 10/2009 | Moisson | 361/679.37 |
| 7,839,637 B2 | * | 11/2010 | Pakravan | 361/695 |
| 8,035,961 B2 | | 10/2011 | Figuerado et al. | |
| 8,077,455 B2 | * | 12/2011 | Jian | 361/679.48 |
| 8,154,863 B2 | | 4/2012 | Yang et al. | |
| 8,300,398 B2 | | 10/2012 | Zhang et al. | |

(Continued)

*Primary Examiner* — Adrian S Wilson

(74) *Attorney, Agent, or Firm* — Brian J. Pangrle

(57) ABSTRACT

An assembly configured for attachment to a media drive can include a handle with a front side, a back side, a hinge end, a swing end and front side to back side air flow passages disposed intermediate the hinge end and the swing end; and a base with a front side, a back side, a hinge end, an opposing end, a pair of front side bevels disposed intermediate the hinge end and the opposing end, and front side to back side air flow passages disposed intermediate the pair of front side bevels, the air flow passages of the base configured to receive air flow from the air flow passages of the handle for a latched orientation of the handle with respect to the base. Various other apparatuses, systems, methods, etc., are also disclosed.

17 Claims, 8 Drawing Sheets

(56) References Cited

U.S. PATENT DOCUMENTS

| | | | |
|---|---|---|---|
| 8,315,052 B2* | 11/2012 | Chan et al. | 361/695 |
| 2002/0017838 A1* | 2/2002 | Roesner et al. | 312/223.1 |
| 2002/0199048 A1* | 12/2002 | Rabinovitz | 710/100 |
| 2003/0002249 A1* | 1/2003 | Cruz et al. | 361/685 |
| 2003/0030978 A1* | 2/2003 | Garnett et al. | 361/687 |
| 2004/0001313 A1* | 1/2004 | Yoshikara | 361/687 |
| 2005/0201053 A1* | 9/2005 | Scicluna et al. | 361/685 |
| 2006/0056150 A1* | 3/2006 | Behl et al. | 361/687 |
| 2006/0227505 A1* | 10/2006 | Miyamoto et al. | 361/695 |
| 2007/0211439 A1* | 9/2007 | Shimizu | 361/724 |
| 2007/0230111 A1* | 10/2007 | Starr et al. | 361/685 |
| 2007/0247805 A1* | 10/2007 | Fujie et al. | 361/687 |
| 2008/0013288 A1* | 1/2008 | Karstens | 361/726 |
| 2008/0049388 A1* | 2/2008 | Shogan et al. | 361/680 |
| 2008/0130219 A1* | 6/2008 | Rabinovitz | 361/685 |
| 2008/0266781 A1 | 10/2008 | Olesiewicz et al. | |
| 2011/0101831 A1 | 5/2011 | Wang et al. | |
| 2012/0236488 A1* | 9/2012 | Wallace et al. | 361/679.31 |
| 2012/0236491 A1* | 9/2012 | Wallace et al. | 361/679.33 |
| 2012/0236492 A1* | 9/2012 | Wallace et al. | 361/679.37 |
| 2012/0236493 A1* | 9/2012 | Wallace et al. | 361/679.37 |
| 2012/0236494 A1* | 9/2012 | Wallace et al. | 361/679.37 |

* cited by examiner

HANDLE ASSEMBLY CONFIGURED FOR AIRFLOW

TECHNICAL FIELD

Subject matter disclosed herein generally relates to technology for a media drive assembly configured, for example, for installation in a server unit.

COPYRIGHT NOTICE

A portion of the disclosure of this patent document contains material to which a claim for copyright is made. The copyright owner has no objection to the facsimile reproduction by anyone of the patent document or the patent disclosure, as it appears in the Patent and Trademark Office patent file or records, but reserves all other copyright rights whatsoever.

BACKGROUND

Conventional server units include bays for installation of media drives such as hard disk drives (HDDs). Such media drives are usually carried in an assembly that allows for installation and removal of a media drive, usually via a handle. Conventional handles usually have a vent pattern that allows for a full view of internal components. Further, such a vent pattern does not typically match other patterns of a server unit or server units in a rack, which adds visual complexity that can cause difficulty in identifying problems quickly. Hence, by increasing the complexity and multitude of vent patterns of server unit components, efficiency of a user to identify problems can be reduced. As described herein, a media drive assembly can include various features that provide for enhanced utility, optionally including an enhanced visual environment.

SUMMARY

An assembly configured for attachment to a media drive can include a handle with a front side, a back side, a hinge end, a swing end and front side to back side air flow passages disposed intermediate the hinge end and the swing end; and a base with a front side, a back side, a hinge end, an opposing end, a pair of front side bevels disposed intermediate the hinge end and the opposing end, and front side to back side air flow passages disposed intermediate the pair of front side bevels, the air flow passages of the base configured to receive air flow from the air flow passages of the handle for a latched orientation of the handle with respect to the base. Various other apparatuses, systems, methods, etc., are also disclosed.

BRIEF DESCRIPTION OF THE DRAWINGS

Features and advantages of the described implementations can be more readily understood by reference to the following description taken in conjunction with examples of the accompanying drawings.

DETAILED DESCRIPTION

The following description includes the best mode presently contemplated for practicing the described implementations. This description is not to be taken in a limiting sense, but rather is made merely for the purpose of describing the general principles of the implementations. The scope of the invention should be ascertained with reference to the issued claims.

Figure 1:
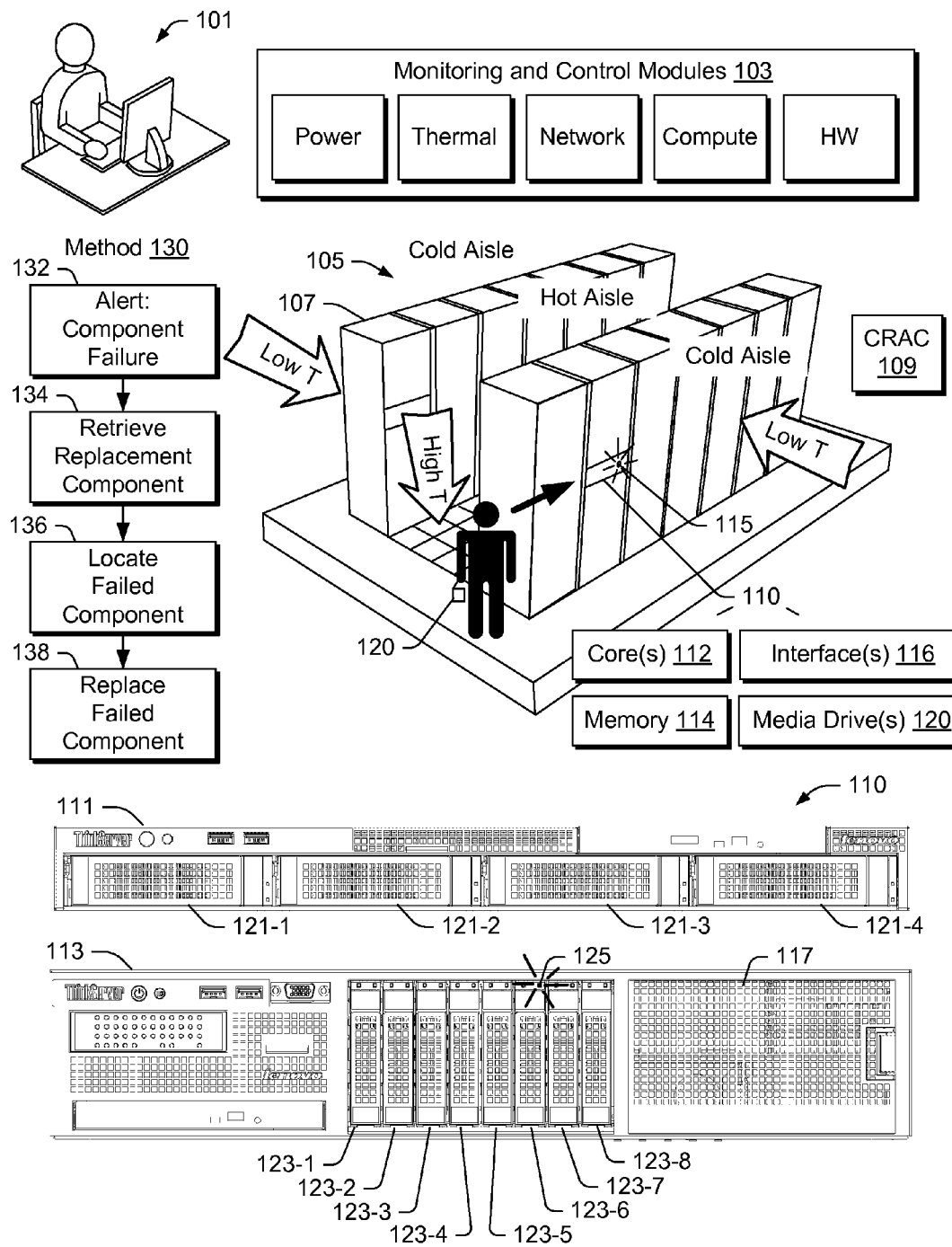
FIG. 1 is a series of diagram related to examples of servers and server operations.

FIG. 1 shows an individual at a control station 101 where the control station 101 may operate in conjunction with one or more modules such as one or more of the monitoring and control modules 103. In the example of FIG. 1, the modules 103 include a power module, a thermal module, a network module, a compute module and a hardware module. The modules 103 may be configured to monitor and control a group of servers 105, which may be arranged in rack towers 107. For example, each of the rack towers 107 may include one or more server unit 110. Each server unit 110 may include one or more processing cores 112, memory 114, one or more interfaces 116 and one or more media drives 120. As an example, each server unit 110 may be configured to access information stored in a media drive 120, transfer accessed information to memory 114, perform computational operations on information in memory 114 and communicate results from computational operations via an interface 116 (e.g., a network interface). As another example, each server unit 110 may be configured to receive information via an interface 116, transfer such information to memory 114 and store such information in a media drive 120. As described herein, each server unit 110 may be configured according to one or more of the foregoing examples or additionally or alternatively according to one or more other manners of operation. Further, as described herein, a server unit includes a server chassis, for example, configured from materials such as metal, plastic, etc., for seating various components.

FIG. 1 also shows a computer room air conditioning (CRAC) unit 109. The CRAC unit 109 is typically a device that monitors and maintains temperature, air distribution and humidity in a network room or data center. In the example of FIG. 1, the CRAC unit 109 may be controlled, monitored, etc., via the one or more modules 103 (e.g., via the control station 101). Mainframes and racks of servers can get as hot as a seven-foot tower of powered toaster ovens, so climate control is an important part of a data center's infrastructure. There are a variety of ways that a CRAC unit can be situated. As an example, a CRAC unit setup can process cooling air and dispense the cooling air (e.g., through an elevated floor). In such an example, cold air flows through the racks (e.g. from "cold aisles") where it picks up heat before exiting from the rear of the racks (e.g., to "hot aisles") and returns to the CRAC unit intake(s). CRAC units in a data center can consume a large fraction of total operational energy. For example, CRAC units may consume 25% or more of the total electricity used by a data center.

FIG. 1 shows two examples of server units 111 and 113. The server units 111 and 113 have substantially rectangular faces configured with bays that seat one or more media drives. As described herein, a bay may refer to an opening defined by at least two walls, which may be configured to receive one or more media drives (e.g., in media drive trays). Each position in a bay configured to receive more than one media drive may be referred to as a media drive bay. Server units such as the units 111 and 113 may be stackable in the towers 107 of the group 105. The example server unit 111 includes four horizontally oriented bays that seat four media drives 121-1, 121-2, 121-3 and 121-4. The example server unit 113 includes a large bay configured with eight vertically oriented media drive bays that seat eight media drives 123-1, 123-2, 123-3, 123-4, 123-5, 123-6, 123-7 and 123-8. The server unit 113 also includes a flush, vented cover 117 that covers an additional unused bay, which upon removal of the cover may optionally seat up to eight additional media drives. As described herein, a media drive may be a hard disk drive (HDD), a solid-state drive, an optical drive or other type of media drive. A HDD may be a standard 2.5 inch drive, a standard 3.5 inch drive or another drive.

Where media drives generate heat, heat is transfer to a cooling fluid (e.g., air), which causes the fluid to rise from an inlet temperature $T_{in}$ to an outlet temperature $T_{out}$. Referring to the examples of FIG. 1, the server unit 111 allows for flow around each media drive 121-1, 121-2, 121-3 and 121-4 as seated in their respective bays. In the server unit 113, heat may be transferred from a media drive (see, e.g., 123-1 to 123-8) to cooling fluid flowing in a gap between adjacent media drives or between a media drive and a wall component of a bay. Heat transfer may be characterized at least in part by the equation: $\Delta Q/\Delta t = h_{plate} A (T_{plate} - T_{in})$. In this equation, the flux of energy ($\Delta Q/\Delta t$) is equal to the heat transfer coefficient for a plate ($h_{plate}$), the area of the plate (A) and the temperature difference between the plate and the cooling fluid ($T_{plate} - T_{in}$). For such an equation, a plate may be a surface of a media drive or other component of a server unit. Heat transfer may optionally be characterized by Reynolds number (ratio of inertial forces to viscous forces), Prandtl number (ratio of kinematic viscosity and thermal diffusivity), Nusselt number (ratio of convective to conductive heat transfer across a surface) or Grashof number (ratio of the buoyancy to viscous force acting on a fluid).

As described herein, velocity of cooling fluid can be important for effective cooling and managing energy costs. In particular, axial velocities (e.g., z direction into a bay) of fluid flowing adjacent a media drive seated in a media drive assembly can be important. As described herein, a media drive assembly can act to increase heat transfer coefficient (h) plate, compared to a conventional media drive assembly. Heat transfer depends on various factors. Where obstructions to flow exist, flow is impeded, which diminishes momentum and typically velocity (e.g., for constant cross-sectional flow area). Accordingly, as described herein, various media drive assembly components can allow for a more unimpeded flow and enhancement of flux of energy from a media drive to a cooling fluid.

As described herein, various keyed components can ensure that media drive assemblies are installed properly into a bay or bays. For example, for the server unit 113, the media drives 123-1 to 123-8 are seated in a relatively uniform manner whereby clearances and heat generation and transfer patterns may be fairly well-known or otherwise understood a priori. More specifically, where conventional components allow for more than one orientation of a media drive in a bay, the selected orientation may not correspond to the most favorable orientation for purposes of heat transfer (e.g., for cooling). Indeed, one side of a media drive may get hotter than another side and where multiple orientations are possible, an operator may install two hot sides adjacent each other. Such situations can give rise to local temperature control issues, which may compromise operation (e.g., increase risk of failure, decrease longevity, etc.). Accordingly, as described herein, keyed components, optionally in combination with other components or features, can act to decrease uncertainty as to cooling and promote operational certainty.

FIG. 1 shows an example of a method 130 that includes an alert block 132, a retrieval block 134, a locate block 136 and a replace block 138. For example, a monitoring module may detect failure of a component in the group 105 and, per the alert block 132, issue an alert. As described herein, an alert may include lighting a diode associated with the failed component. For example, each tower in a server group (or server farm) may include a series of diodes where an alert causes emission of light from a diode where the light is transmitted via a light pipe (or guide) to a face of a server unit (see, e.g., end of light pipe 115 as associated with the server unit 110). Per the method 130, a retrieval block 134 calls for retrieval of a replacement component, which may be a manual or automated (e.g., robotic) process. Per the locate block 136, the failed component is located, for example, by an operator that may visually inspect the towers and associated server units to locate the particular, failed component. Again, in the example of FIG. 1, the light pipe end 115 facilitates visual location of a failed component. Once located, per the replace block 138, an operator may remove the failed component and replace it with the retrieved replacement component.

In general, the method 130 should be performed in a timely and accurate manner. As described herein, a server unit may include a substantially flush face such that visual inspection of a tower or group of towers readily reveals a status indicator (e.g., diode, end of light pipe, etc.). For example, the server unit 111 or the server unit 113 may be configured with a substantially flush face to avoid blocking emission of light from a status indicator and to allow for viewing of a status indicator from wide angles and many lines of sight. For example, the server unit 113 includes the media drive 123-6 with a status indicator 125 that can emit light in wide angle cone, substantially free from interference from other features of the server unit 113. As described herein, keyed components (e.g., of a bay, a tray, a bay and tray, etc.) that promote uniformity can also decrease visual complexity and allow for an enhanced visual environment that facilitates locating and replacing troubled components.

Referring to the example server units 111 and 113, visual uniformity is enhanced by providing media drive assemblies with vented handles where the vents have a pattern that matches other vent patterns of the server units 111 and 113. For example, the server units 111 and 113 include rectangular air flow passages over various portions of their faces, including the handles of the media drive assemblies 121-1, 121-2 and 121-3 as well was 123-1 to 123-8. Accordingly, when a status light is illuminated, the reduced visual complexity of the vents actually enhances a user's ability to locate the illuminated status light. Further, where the server units 111 and 113 are provided in a dark finish (e.g., black finish), contrast between a face of a server unit and an illuminated status light is enhanced. As mentioned, keyed components can act to ensure that handles face the same direction, which can reduce confusion and expedite replacement of a media drive (e.g., a media drive of a media drive assembly seated in a bay).

As described in various examples herein, a handle of a media drive assembly can be configured to cover most of the front face of the media drive assembly (e.g., but for a button and a surface with one or more status indicators). Further, a handle can be vented to permit sufficient airflow while also providing a visual screen to screen the components inside (e.g., to reduce visual complexity). By utilizing the same vent pattern on a handle as used on a rack mounted server, it is possible to create such a handle with optimum cooling capability while at the same time lessening visual complication for a user. Overall, for such an approach, a user is able to identify problems faster with a visually clean surface to the front of the server unit.

Figure 2:
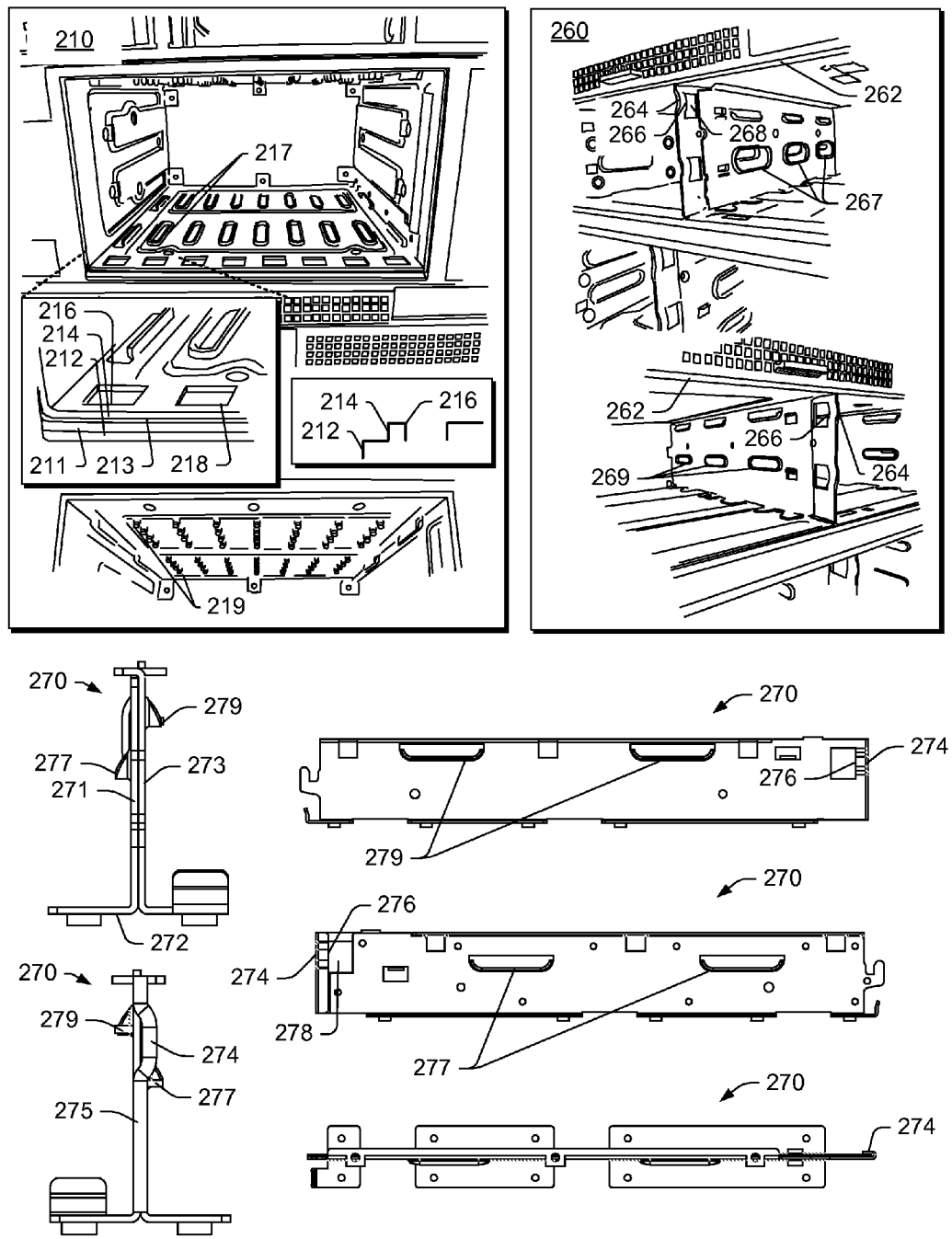
FIG. 2 is a series of diagrams of examples of bays and bay components.

FIG. 2 shows views of some examples of bays 210 and 260 and a bay component 270. The bay 210 is configured to accommodate eight media drives oriented vertically (e.g., eight individual media drive bays) and the bay 260 is configured to accommodate two media drives oriented horizontally between an end wall and an interior wall, two interior walls or two end walls (e.g., two individual media drive bays). The bay component 270 is formed from two plates 271 and 273, bent to form a base 272, and an end cover 275 (e.g., formed by a 180 degree bend of the plate 273) where each of the plates 271 and 273 is configured to abut an edge of a rail attached to a media drive along one or more punch-out portions or protrusions 277 and 279 that extend outwardly from respective plates 271 and 273. As described herein, by bending the plate 273 by 180 degrees, the end thickness is doubled, which provides for additional integrity to a surface 274. As described herein, the surface 274 can be leveraged by an end of a handle to translate a media drive assembly (e.g., to extract a media drive assembly from a bay).

Referring to the bay 210, for each media drive slot, a first front facing surface 212 steps to a shoulder with a recessed, second front facing surface 214. The recessed front facing surface 214 of the shoulder rises to a flat surface which extends inwardly in the bay to a stop surface 216, which may be, for example, an edge of an opening 218. As described herein, for the bay 210, the surface 212 may be a surface of a bezel component 211 while the recessed surface 214 and the stop 216 may be surfaces of a bay component 213 that abuts the bezel component 211. The bay component 213 includes protrusions 217 that separate and define slots where the protrusions 217 are configured to abut at least one edge of a rail attached to a media drive (e.g., one edge of one rail of a media drive and one edge of another rail of another media drive). As described herein, each of the protrusions 217 and each of the openings 218 may optionally be formed by punching a piece of sheet metal. In the example of FIG. 2, a top side of the bay 210 includes a series of nubs 219 that separate and define slots where the series of nubs 219 are configured to abut at least one edge of a rail attached to a media drive (e.g., one edge of one rail of a media drive and one edge of another rail of another media drive).

Referring to the bay 260, a first front facing surface 262 steps to a shoulder with a recessed, second front facing surface 264. The recessed front facing surface 264 traverses to a curved surface that extends inwardly to a stop 266, which may be, for example, an edge of an opening 268. As mentioned, the bay 260 is configured to receive two media drives, stacked and oriented horizontally. The bay 260 includes sets of protrusions 267 on one side and sets of protrusions 269 on another side. For example, a lower set of protrusions provide for alignment of an upper edge of a rail attached to a first media drive seated in a lower slot (e.g., a lower individual media drive bay) as well as alignment of a lower edge of another rail attached to a second media drive seated in an upper slot (e.g., an upper individual media drive bay) while an upper set of protrusions provide for alignment of a lower edge of the rail attached to the second media drive seated in the upper slot.

Various features of the bay component 270 appear correspondingly in the bay 260. For example, the surface 274 corresponds to the recessed surface 264, the stop 276 corresponds to the stop 266, and the opening 278 corresponds to the opening 268. Noting that the bay 260 includes one set of features for each slot. As shown in the example of FIG. 2, by folding an end of the plate 273 180 degrees, the thickness is doubled and the stop 276 may be formed or strengthened. As described herein, such a fold (or bend) can provide for the surface 274 and the stop 276, with sufficient integrity to lock a media drive assembly in a bay (i.e., via the stop 276) and to extract a media drive assembly from a bay (i.e., via the surface 274), for example, to translate the media drive assembly a distance that decouples a connector.

Figure 3:
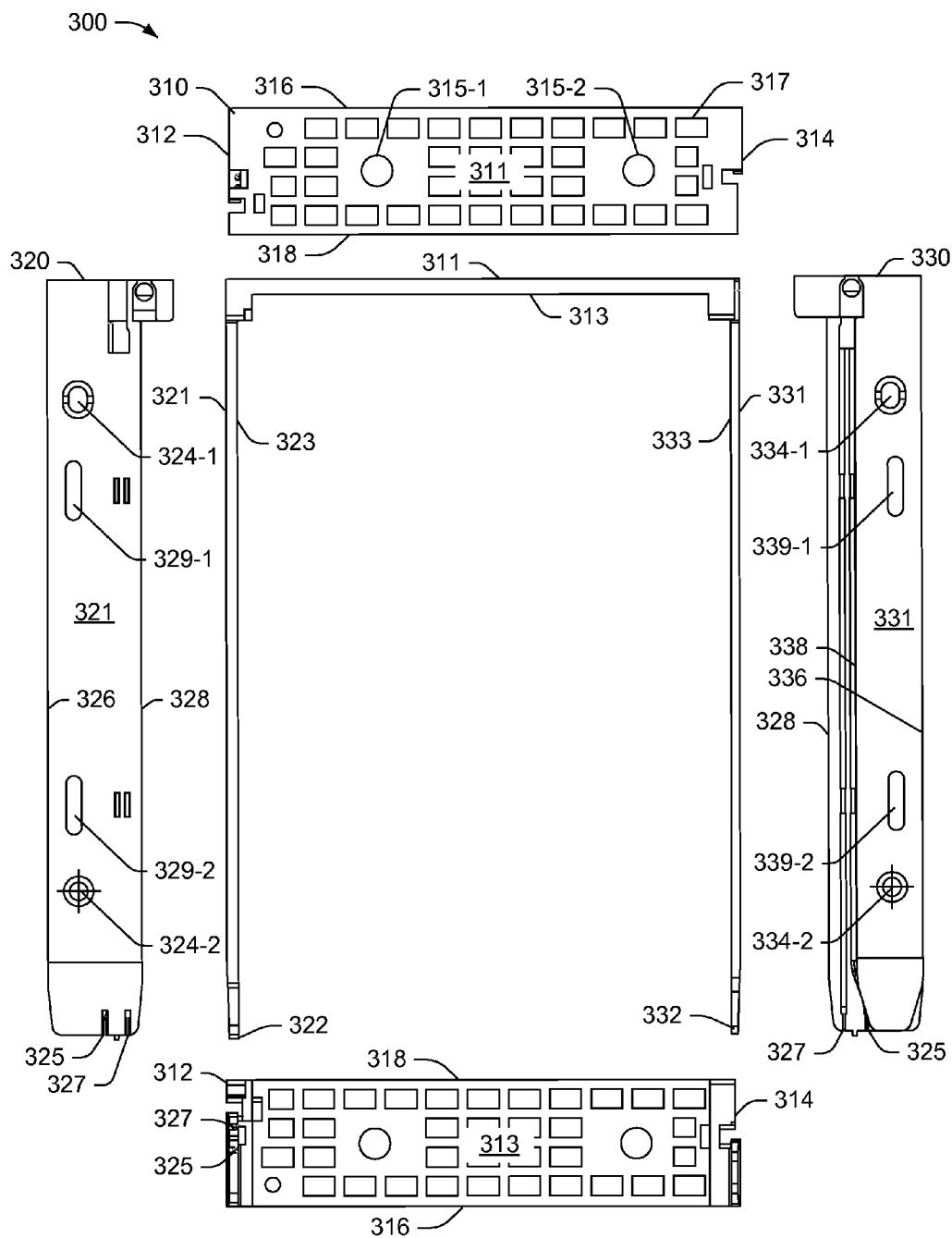
FIG. 3 is a series of views of an example of a tray for a media drive.

FIG. 3 shows various views of an example of a tray 300 with rails 320 and 330 configured for attachment to a media drive. In the example of FIG. 3, the tray 300 includes a front plate 310 with a front surface 311 and a back surface 313. As shown, the rails 320 and 330 extend outwardly from the back surface 311 perpendicular to a plane defined by the front plate 310. The front plate 310 includes opposing sides 312 and 314, a top edge 316 and a bottom edge 318. The front plate 310 includes features 315-1 and 315-2 for attachment to a handle unit (e.g., to facilitate installation and removal of a media drive from a bay). The front plate 310 also includes passages 317 for flow of air, for example, for cooling a media drive secured in the tray 310 and seated in a bay.

In the example of FIG. 3, the rails 320 and 330 are different. Specifically, one rail has a different configuration than the other rail; accordingly, the rails are asymmetric (i.e., not merely right hand/left hand mirror images). As shown, the rail 320 is larger with a greater height than the rail 330. Further, the rail 320 includes at least one light guide 325 and 327 (e.g., for transmitting light signals as to status of a media drive, etc.). The rail 320 has a free end 322, a bay side surface 321, a media drive side surface 323, a lower edge 326 and an upper edge 328. In the example of FIG. 3, the rail 320 includes attachment features 324-1 and 324-2 as well as openings 329-1 and 329-2.

As shown, the rail 330 is smaller with a smaller height than the rail 320. The rail 330 has a free end 332, a bay side surface 331, a media drive side surface 333, a lower edge 336 and an upper edge 338. In the example of FIG. 3, the rail 330 includes attachment features 334-1 and 334-2 as well as openings 339-1 and 339-2.

As mentioned with respect to FIG. 1, a handle of a media drive assembly can be configured to cover most of the front face of the media drive assembly (e.g., but for a button and a surface with one or more status indicators). Further, a handle can be vented to permit sufficient airflow while also providing a visual screen to screen the components inside (e.g., to reduce visual complexity). Yet further, by utilizing a vent used on a rack mounted server (see, e.g., the server units 111 and 113 of FIG. 1), it is possible to create a handle with cooling capability while at the same time lessening visual complication for a user. As described herein, such an approach can provide for an enhanced visual environment.

Figure 4:
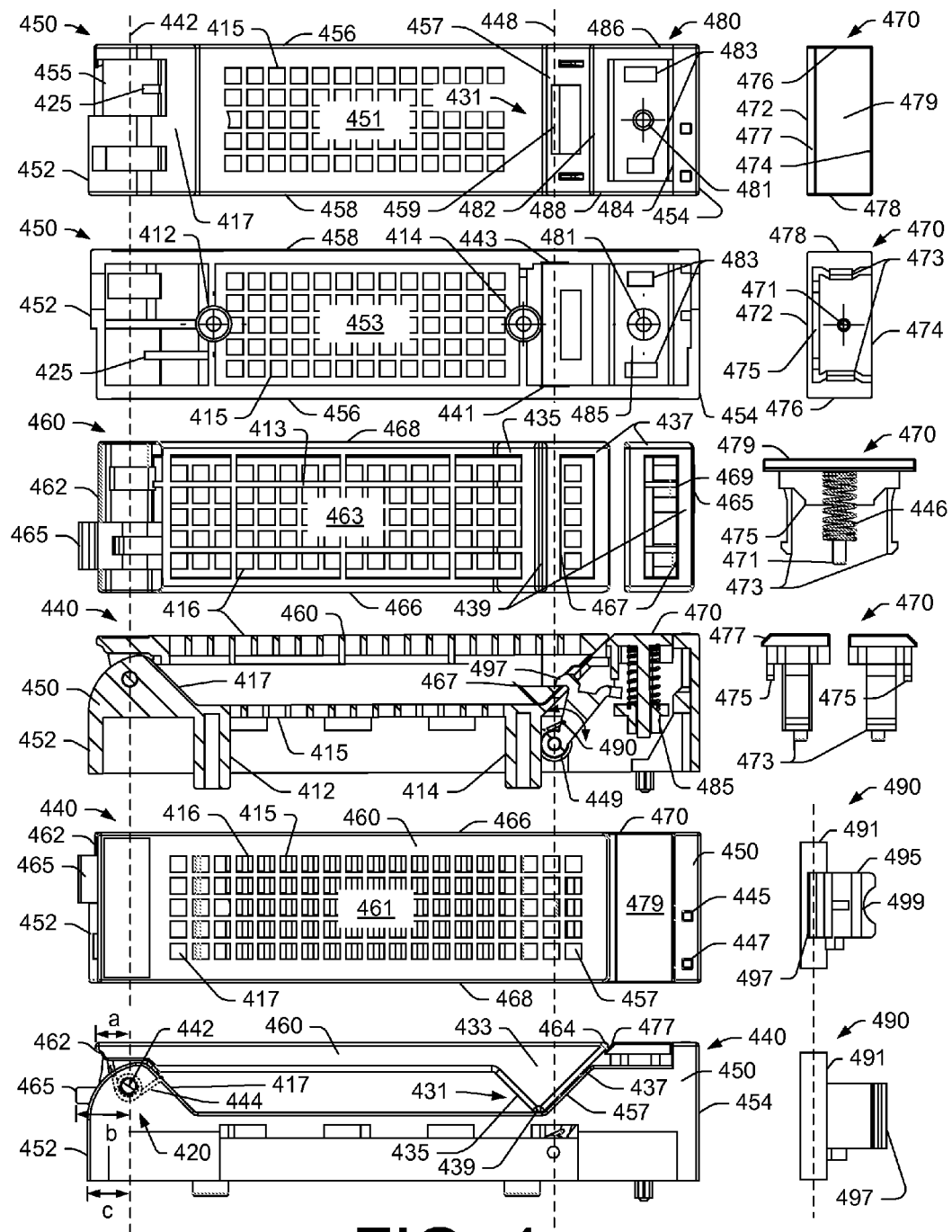
FIG. 4 is a series of views of an example of a handle unit for a media drive assembly.

FIG. 4 shows an example of a handle unit 440, which is an assembly of various components. The handle unit 440 may have a visual appearance that matches one or more portions of a server unit (see, e.g., the server units 111 and 113 of FIG. 1), for example, to reduce visual complexity and provide an enhanced visual environment.

In the example of FIG. 4, the handle unit 440 includes a base 450, a handle 460, a button 470 and a latch 490. As shown, the base 450 includes a chamber 480 for seating the button 470 and the latch 490, which upon depression of the button 470 a certain distance, the button 470 contacts the latch 490 for release of a swing end 462 of the handle 460 such that the handle 460 can rotate with respect to the base 450 about a hinge axis 442. As shown in FIG. 4, a pivot axis 448 is shown for the latch 490. In the side views, the dashed lines for the hinge axis 442 and the pivot axis 448 passes through the end of the axes, respectively. As described herein, an axis may be defined by a pin, pins or other component(s), for example, the assembly 440 may include a hinge pin along the hinge axis 442 and a latch pin along the pivot axis 448.

The base 450 include a front side 451, a back side 453, a hinge end 452 and an opposing end 454, which may be configured as a flat end. Disposed intermediate the hinge end 452 and the end 454 is a latch surface 457, which is set at an angle (e.g., beveled). The latch surface 457 may form a grip seat 431 with another surface or surfaces of the front side 451 of the base 450. In the example of FIG. 4, the base 450 also includes light guides 445 and 447, which may cooperate with the light guides 325 and 327 of the tray 300 of FIG. 3.

The base 450 further includes air flow passages 415, which in the example of FIG. 4, are arranged in a substantially rectangular grid pattern. Such a pattern may be selected based at least in part on a pattern found on a server unit. As described herein, careful selection of shape, size and arrangement of features can reduce visual complexity.

As shown in FIG. 4, the passages 415 pass from the front side 451 to the back side 453 of the base 450. As mentioned, the latch surface 457 is set at an angle. Further, another surface 417 of the front side 451 of the base 450 is set at an angle. In the example of FIG. 4, the air flow passages 415 are disposed on a substantially planar portion of the front side 451 of the base 450 intermediate the angled surfaces 417 and 457. Accordingly, air is directed to the passages 415 via a rectangular funnel defined at least in part by the angled surfaces 417 and 457. Such a funnel can act to increase air velocity (e.g., mass flow of cooling fluid is directed from a larger cross-sectional area to a smaller cross-sectional area).

The base 450 also includes posts 412 and 414, which may be configured to receive plugs, bolts, screws, etc., to connect the base 450 to the tray 300 via the attachment features 315-1 and 315-2, as shown in the example of FIG. 3. Upon attachment, the air flow passages 317 of the tray 300 are available to receive air that passes through the air flow passages 415 of the base 450.

In the example of FIG. 4, the handle 460 is shown as including a front side 461 and a back side 463, disposed between a hinge end 462 and the swing end 464. Further, the handle 460 includes a surface 467 (e.g., a latching surface which may be part of a column) that cooperates with a prong 497 of the latch 490 to maintain the handle 460 in a closed orientation with respect to the base 450. The handle 460 also includes an optional locking tab 465, which may be configured to cooperate with a stop of a bay (see, e.g., the stops 216, 266 and 276 of FIG. 2) to lock an assembly in a bay. As shown in FIG. 4, the locking tab 465 can rotate into a chamber 455 of the base 450 upon swinging open the swing end 464 of the handle 460.

In the example of FIG. 4, the handle 460 includes a back side grip feature or grip 433 that can be seated in the grip seat 431 of the base 450 when the handle 460 is in a closed or locked or latched orientation with respect to the base 450. The grip feature or grip 433 has a substantially triangular shape with two legs formed by angled frames 435 and 437 that extend to a column 439. The front side 461 of the handle 460 serves as a third leg of the triangular shape.

The handle 460 further includes air flow passages 416, which in the example of FIG. 4, are arranged in a substantially rectangular grid pattern. Such a pattern may be selected based at least in part on a pattern found on a server unit. As described herein, careful selection of shape, size and arrangement of features can reduce visual complexity and provide for an enhanced visual environment.

As shown in FIG. 4, the passages 416 pass from the front side 461 to the back side 463 of the handle 460. When the handle 460 is in a closed orientation with respect to the base 450, air is directed from the passages 416 to the passages 415 via a rectangular funnel defined at least in part by the angled surfaces 417 and 457. Such a funnel can act to increase air velocity as mass or volumetric flow of cooling fluid is directed from a larger cross-sectional area defined by the passages 416 of the handle 460 to a smaller cross-sectional area defined by the passages 415 of the base 450.

Further, as shown in the example of FIG. 4, the passages 416 of the handle 460 are off-set from the passages 415 of the base 450. As described herein, offsetting of air flow passages of a handle from those of a base can act to screen a user's view of a component or components that may reside behind the base when the handle is in a closed, locked or latched orientation. Further, such an approach does not necessarily give rise to any substantial pressure loss due to lack of visual alignment (e.g., due to a gap that exists between the passages 416 of the handle 460 and the passages 415 of the base 450). In FIG. 4, the arrangement of the passages 416 and 415 may also be observed in the cross-sectional view of the handle 460 and the base 450.

In the example of FIG. 4, the handle 460 is shown as including ribs 413 along the back side 463. As described herein, the ribs 413 can add to structural integrity of the handle 460 for purposes of gripping (e.g. per the grip 433) as well as for allowing significant cross-sectional area for air flow (e.g., per the passages 416). The ribs 413 may include horizontal and vertical ribs set orthogonally. In the example of FIG. 4, the ribs 413 include three interior vertical ribs and two interior horizontal ribs. The ribs 413 may be configured to avoid interference with cross-sectional area of the individual air flow passages 416. For example, ribs may have a rib width that is approximately equal to the space between two adjacent air flow passages.

As described herein, features of a handle grip may add to structural integrity of a handle in a manner that allows for an increase in flow area of the handle. Referring to the frames 435 and 437 and the column 439, such features may be configured to allow for relatively unobstructed air flow through the passages 416 of the handle 460 to the passages 415 of the base 450. In the example of FIG. 4, the handle 460 includes passages 416 along the front portion of the grip 416 while the frames 435 and 437 define relatively wide windows. In particular, the frame 435 provides a window for flow of air from the passages 416 located along the front portion of the grip 433 to the passages 415 of the base 450 when the handle 460 is in a closed, locked or latched orientation.

In the example of FIG. 4, a handle stop mechanism 420 includes a stop 425 set in the chamber 455 that can stop rotation of the handle 460 by contacting the locking tab 465. Specifically, as the handle 460 rotates about the hinge axis 442, the locking tab 465 rotates into the chamber 455 and eventually contacts the stop 425, which provides for a predetermined angle of rotation of the handle 460. As described herein, the stop angle can determine the position of the grip 433 with respect to the base 450. For example, the stop angle (e.g., configuration of the locking tab 465 and the stop 425) can allow for positioning the grip 433 approximately midway between the hinge end 452 and the opposing end 454 of the base 450. In such a position, force may be relatively evenly applied to extract a media drive assembly from a bay.

Specifically, the angle of rails with respect to bay features may be favorable for minimizing friction or wear.

In the example of FIG. 4, the chamber 480 defined by the base 450 accommodates the button 470 and the latch 490. The chamber 480 includes features for retention and operation of the button 470 such as an opening 481, a pair of retainer openings or sockets 483 (e.g., of different widths), a retainer surface 485 (e.g., a button stop), a top latch side 482, an opposing side 484, an upper side 486 and a lower side 488. The chamber 480 further includes sockets 441 and 443 for receipt of respective ends of the latch 490 and for pivoting of the latch 490 about the pivot axis 448. In the example of FIG. 4, a spring 449 acts to bias the latch 490 in a counter-clockwise direction with respect to the base 450 about the pivot axis 448 (e.g., optionally defined by a pin or other feature or features).

In the example of FIG. 4, the button 470 includes a pair of long edges 472 and 474, a pair of short edges 476 and 478, a front side 479 and a beveled edge 477 (e.g., set at a bevel angle) disposed between the long edge 472 and the front side 479. Extending from a back side, the button 470 includes a stem 471, a pair of retainers 473 (e.g., of different widths), and a latch contacting surface 475. As shown in FIG. 4, the front side 479 is flat and may be colored similarly to the color of the handle 460. An option may exist to provide the beveled surface 477 with a color that differs from that of the front side 479 of the button 470. Such a color may stand out visually when a handle is unlatched and slightly open.

In the example of FIG. 4, the latch 490 includes a shaft portion 491, an actuation surface 495, a prong 497 and an edge 499 with a cut-out (e.g., semi-circular in shape) to accommodate the button 470 as seated in the chamber 480 with a button spring 446 (e.g., consider a cylindrical coil spring). As indicated in FIG. 4, the latch 490 can rotate about its shaft portion 491, for example, responsive to contact with the handle 460 or contact with the latch contacting surface 475 of the button 470.

As shown in a cross-sectional view of FIG. 4, in a closed or locked (or latched) orientation of the handle 460 with respect to the base 450, the prong 497 of the latch 490 enters an opening 469 defined by the frame 437 of the swing end 464 of the handle 460 where the prong 497 contacts a surface 467 (e.g., defined by the frame 437 or the column 439 or otherwise accessible via the opening 469). Again, as mentioned, for the example of FIG. 4, the spring 449 biases the latch 490 in a counter-clockwise direction such that the prong 497 biases the swing end 464 of the handle 460 against a front side 451 of the base 450 and, more specifically, maintains the grip 433 of the handle 460 in the grip seat 431 of the base 450.

In the example of FIG. 4, the button 470 includes a latch contacting surface 475 extending outwardly away from a back side of the button 470 where, for an un-depressed orientation, the spring 446 biases the retainers 473 against the button stop 485 to maintain a gap between the latch contacting surface 475 and the actuation surface 495 of the latch 490. As described herein, the gap is, at times, referred to herein as a "pre-travel" gap. Referring to FIG. 4, the button 470 may be depressed a pre-travel distance without affecting the latch 490; thus, maintaining the handle 460 in a closed or locked orientation with respect to the base 450.

As described herein, the handle 460 is configurable in a locked orientation and an unlocked orientation with respect to the base 450 where the locked orientation corresponds to a locked angle of rotation of the handle 460 about the hinge axis 442 having an end of the locking tab 465 rotated outwardly away from the hinge end 452 of the base 450, the swing end 464 of the handle 460 rotated inwardly toward the base 450 and the hinge end of the base 452 extending outwardly beyond the hinge end 462 of the handle 460 and where the unlocked orientation corresponds to an unlocked angle of rotation of the handle 460 about the hinge axis 442 having an end of the locking tab 452 rotated inwardly toward the hinge end 452 of the base 450, the swing end 464 of the handle 460 rotated outwardly away from the base 450 and the hinge end 462 of the handle 460 extending outwardly beyond the hinge end 452 of the base 450.

FIG. 4 shows distances a, b and c, which correspond to dimensions measured from the hinge axis 442 to the hinge end 462 of the handle 460 ("a"), the hinge axis 442 to an end of the locking tab 465 ("b") and from the hinge axis 442 to the hinge end of the base 452 ("c"). Accordingly, in the locked orientation, the hinge end 452 of the base 450 extends outwardly beyond the hinge end 462 of the handle 460 (i.e., c>a). Such an arrangement allows for the hinge end 462 of the handle 460 to contact a recessed surface (see, e.g., surfaces 214, 264 or 274) of a bay component and allow the handle 460 to be flush with a surface of a server rack or unit (see, e.g., surfaces 212 or 262). Flush mounting of a handle can reduce visual complexity and enhance the visual environment.

Also shown in the example of FIG. 4, the locking tab 465 is positioned along an upper half of the assembly 440 and opposite the side with one or more status indicators 445 and 447 (see, e.g., light guides 325 and 327 of FIG. 3). Such an arrangement of features allows for the smaller rail 330 (e.g., without the light guides) to be positioned below the surface 274 of the bay component 270 (e.g., aligned per the protrusion 277) where the surface 274 can be curved inwardly towards the bay and available as a contact point for leverage by a biasing surface of the hinge end 462 of the handle 460. As shown in the bay 260 of FIG. 2, a bay component may include one such surface per slot, which, upon assembly of a bay, becomes a recessed surface (e.g., in comparison to the surface 262).

In the example of FIG. 4, a spring 444 biases the handle 460 about the hinge axis 442 with respect to the base 450. Accordingly, upon release of the swing end 464, the spring 444 causes the swing end 464 of the handle 460 to swing outwardly, rotating about the hinge axis 442 such that the hinge end 462 rotates inwardly and the locking tab 465 rotates inwardly to a chamber 455 at the hinge end 452 of the base 450.

As described herein, an assembly, configured for attachment to a media drive, can include a handle with a front side, a back side, a hinge end, a swing end and front side to back side air flow passages disposed intermediate the hinge end and the swing end; and a base with a front side, a back side, a hinge end, an opposing end, a pair of front side bevels disposed intermediate the hinge end and the opposing end, and front side to back side air flow passages disposed intermediate the pair of front side bevels, the air flow passages of the base configured to receive air flow from the air flow passages of the handle for a latched orientation of the handle with respect to the base. In such an example, the air flow passages may optionally be arranged in a pattern that matches a pattern of a server unit (see, e.g., the server units 111 and 113 of FIG. 1). Such an arrangement can reduce visual complexity and enhance the visual environment of a server unit, server rack, data center, etc. Further, a handle may include a pattern for air flow passages that provides for adequate air flow while visually blocking a component or components that reside behind the handle. As described herein, a pattern for air flow passages of a handle and of a base may be selected and off-set to block visual complexity (e.g., to hide from view components that reside behind a handle and a base). For example, for a latched orientation, air flow passages of the handle may be offset from air flow passages of the base to create a visual screen.

As described herein, a back side of a handle can include structural support ribs, for example, where the structural support ribs include orthogonally oriented ribs. As described herein, air flow passages of a handle may have substantially rectangular cross-sectional areas (e.g., oriented rectangular fashion, optionally dictated by orthogonal ribs).

As described herein, a handle can include a back side bevel at a latch end configured to seat against a front side bevel of a base. In such an example, the back side latch bevel (e.g., an angled frame) can include an opening configured to receive a latch extending from the front side bevel of the base (e.g., via an opening of the front side bevel of the base).

As described herein, a handle can include a grip disposed adjacent a swing or latch end of the handle. Such a grip can include a column set inwardly from the swing end of the handle and extending from a top side to a bottom side of the handle where the column is configured to seat against a front side of a base for a latched orientation. Further, a gap may exist between the column and air flow passages of the handle. As to a column, a grip may include bevels (e.g., angled surfaces, angled frame, etc.) that join the column. Such a column can include a triangular cross-sectional area that optionally provides a surface for seating a prong of a latch (e.g., for a latched orientation).

As described herein, for a latched orientation, a pair of front side bevels of a base can be configured to direct air flow to air flow passages of the base. As described herein, the number of air flow passages of a handle may exceed the number of air flow passages of a base. For example, where the handle grid area for air flow passages exceeds that of the base, if the individual passages of the handle and the base are approximately the same size and spacing, the number of passages of the handle can exceed the number of passages of the base.

Figure 5:
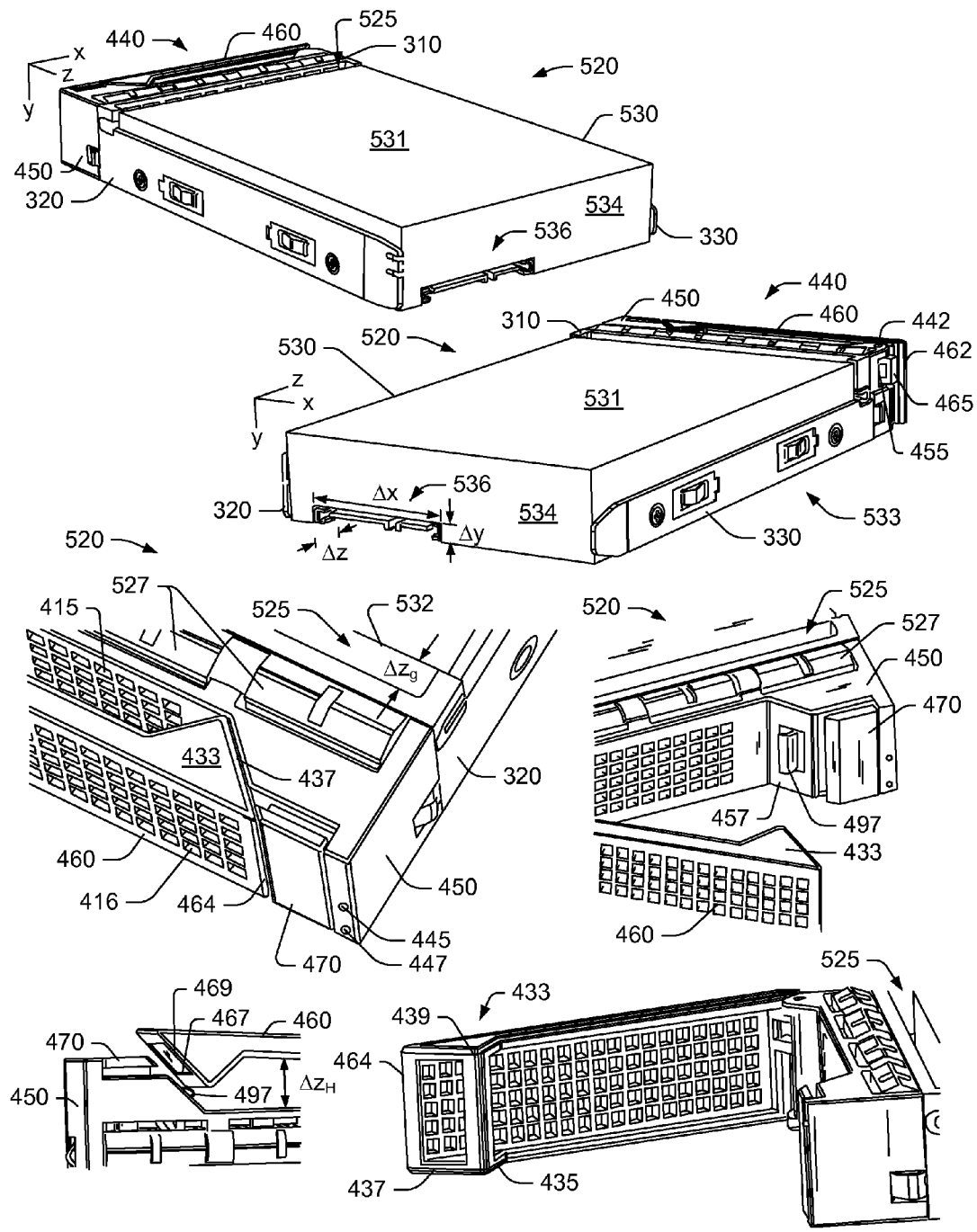
FIG. 5 is a series of perspective views of an example of an assembly with a media drive.

FIG. 5 shows various perspective views of an example of an assembly 520 that includes a media drive 530. The assembly 520 includes the tray 300 and the handle unit 440. The media drive 530 includes a top surface 531, a bottom surface 533, a front surface 532 and a back surface 534. The tray 300 is fitted to the media drive 530 and attached to the base 450 such that a gap (e.g., $\Delta z_g$) exists between the front surface 532 of the media drive 530 and the back side 313 of the front plate 310 of the tray 300. Spring clips 527 may be fit between the base 450 and the front side 311 of the front plate 310 of the tray 300.

In the example of FIG. 5, air can flow from the passages 416 of the handle 460 to the passages 415 of the base 450 and to the passages 317 of the front plate 310 of the tray 300 and across the gap 525 to contact at least the front surface 532 of the media drive 530. When the assembly 520 is seated in a bay, air flow may then pass along at least the top surface 531 of the media drive 530 and, for example, the bottom surface 533 of the media drive 530 (e.g., accordingly to clearances between the media drive 530 and a bay component surface or surfaces, clearances between adjacent media drives, etc.). As described herein, a bay and air moving equipment are typically configured to draw air from front to back. Accordingly, air is typically drawn through a bay due to low pressure (e.g., as provided by an air inlet to a fan).

In the example of FIG. 5, the rail 330, which has a smaller height (e.g., along a y dimension) compared to the rail 320, is attached to a side of the media drive 530 that corresponds to the hinge end 462 of the handle 460, as well as the locking tab 465.

In the example of FIG. 5, the media drive 530 is shown as having a back side connector or connectors 536 configured for connecting the media drive 530 to a power source, information bus, etc. In the example of FIG. 5, the connector 536 has a depth dimension ($\Delta z$), which represents a sliding distance, for example, between two components from being in contact with each other to fully connected or from fully connected to being disconnected from each other.

As described herein, a server unit or chassis can include one of more types of bays for receipt of one or more types of media drives where each drive is carried in a tray with a handle unit, sometimes referred to as a caddy. Such media drives may optionally be of a so-called "small form factor" (SFF), for example, consider the SFF 3.5 inch or SFF 2.5 inch standards, which are common for hard disk drives (HDDs).

A perspective front side view of the assembly 520 shows flush alignment of the base 450, the handle 460 and the button 470 (e.g., for a closed or locked or latched orientation of handle 460 with respect to the base 450). Three perspective views of the assembly 520 show an open or unlocked or unlatched orientation of the handle 460 with respect to the base 450 where the grip 433 of the handle 460 is unseated from the seat 431 of the base 450. Also shown is the latch surface 457 of the base 450, the prong 497 of the latch 490 and the surface 467 accessible via the opening 469 of the handle 460.

As described herein, various features of an assembly provide for user comfort. For example, the shape of the prong 497 and its location with respect to the latch surface 457 of the base 450 act to avoid scratching a user's fingers (e.g., or finger nails). In particular, the prong 497 is relatively smooth on its outwardly facing surface when in the unlatched orientation. Further, the prong 497 is of a sufficient length to avoid catching a finger, a problem experienced with short prongs (e.g., that readily expose a user's fingers to sharp ends). Also consider the dimension $\Delta z_H$, shown in one of the perspective views of FIG. 5, which indicates an unlatched distance for insertion of a user's finger to open the handle 460 more fully. As shown, the shape of the grip 433 of the handle 460 acts to avoid contact between a user's finger and the prong 497.

As described herein, a media drive assembly may be optionally configured for a hot-swap. For example, to remove such an assembly, a user presses on a flat flush surface of a release button (see, e.g., the button 470 in FIG. 5) where the applied pressure causes an internal latch to release (see, e.g., the prong 497 in FIG. 5). In various examples, a handle is biased by a spring about a hinge axis (see, e.g., the axis 442 and the spring 444 in FIG. 4), which causes the handle to rotate outward to an "open" position with respect to a base (see, e.g., the distance $\Delta z_H$ in FIG. 5). In this open position, the geometry of the base and the handle present a convenient recess for the user to reach into with his or her finger or fingers and grasp the handle where the recess can guide a user's hand toward various surfaces via smooth surfaces of the assembly (e.g., to provide for proper hand/handle alignment and grip). As described herein, a release catch (e.g., prong) can be placed at an area of a recess (e.g., the grip seat 431) to prevent or minimize user contact.

In the example of FIG. 5, a space exists between the handle 460 and the base 450, which is enlarged upon release of the swing end 464 of the handle 460 (e.g., by depressing the button 470). The space between the handle 460 and the base 450 may be referred to as being a rectangular funnel or having a rectangular funnel shape, for example, where the surfaces 417 and 457 of the base 450 direct air to the air flow passages 415 of the base. The surfaces of the grip 433 of the handle may be smooth to improve feel and avoid injury or damage to fingers (e.g., including finger nails).

Figure 6:
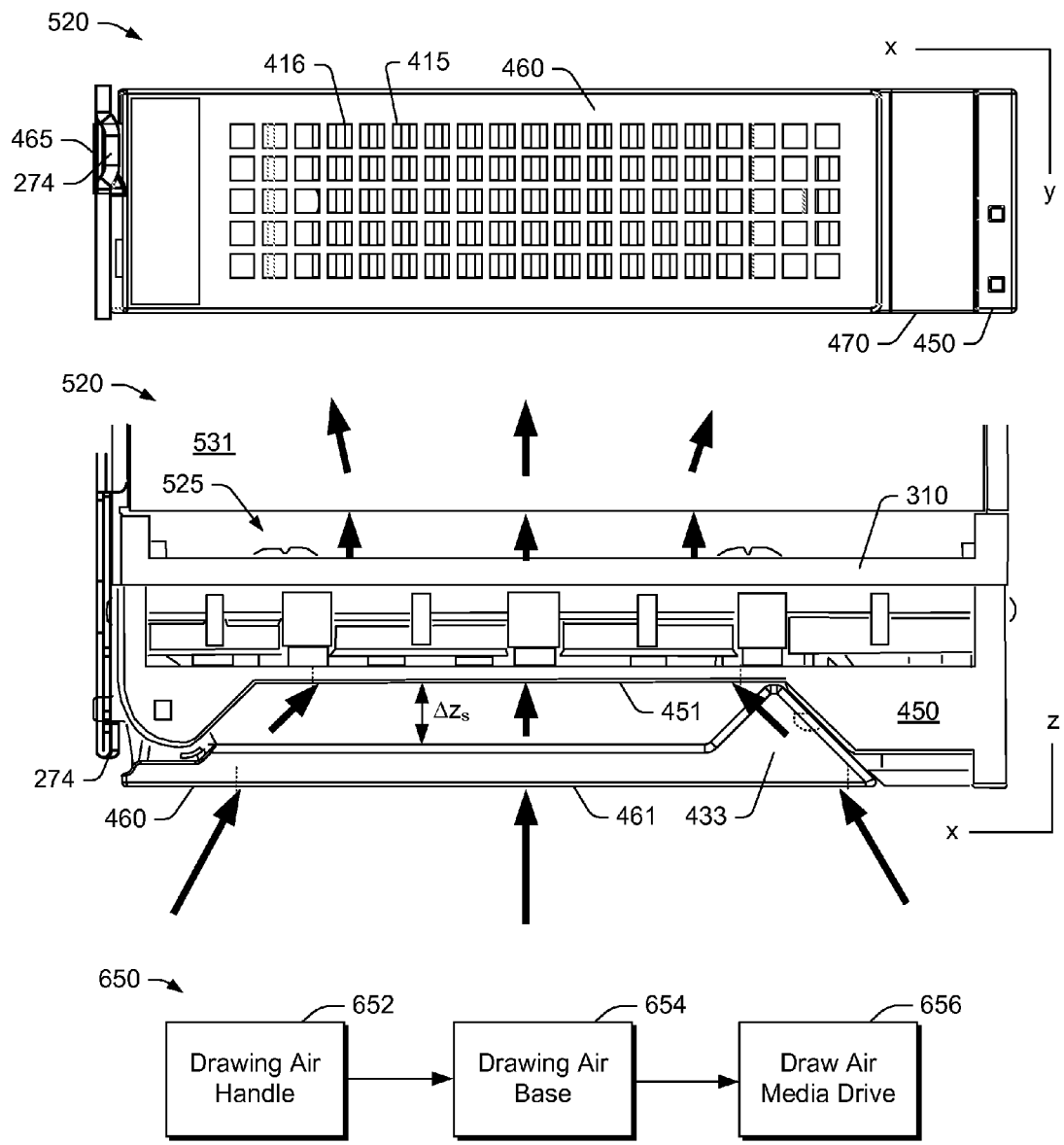
FIG. 6 is a series of views of an example of an assembly and a block diagram of a method.

FIG. 6 shows a front view and a top view of the assembly 520 along with a block diagram of an example of a method 650. Also shown in the front and top views is a surface 274 of a bay component. The top view of the assembly 520 includes arrows that generally indicate directions of air flow through the handle 460, the base 450 and the front plate 310 to the gap 525 and with respect to the top surface 531 of the media drive 530.

In the front view of FIG. 6, the off-set between the passages 416 and the passages 415 is shown along an x, y-plane. From the front view, various individual passages 416 of the handle 460 allow for viewing a divider that separates two individual passages 415 of the base. Such an arrangement acts a visual screen to screen a user's view of a component or components that may lie behind the base 450 (e.g., the tray plate 310, the media drive 530, etc.). In such an example, the pattern of the passages 416, which are the outermost passages, may match that of a portion of a server unit (see, e.g., the server units 111 and 113 of FIG. 1). As described herein, for one or more components (e.g., a handle, a base, a handle and a base) passage sizes, number, shape, arrangement may be selected to provide for visual screening (e.g., to reduce visual complexity).

In the example of FIG. 6, dashed lines indicate the approximate width (e.g., along an x-coordinate) of the air flow passage grid on the front surface 461 of the handle 460 and of the air flow passage grid on the front surface 451 of the base 450. As mentioned, the handle 460 and the base 450 define a space with a rectangular funnel shape (e.g., from a larger cross-sectional flow area to a smaller cross-sectional flow area). Depending on configuration of a bay or proximity of one or more adjacent assemblies, some flow may occur from the space between the handle 460 and the base 450 outwardly (e.g., upwards or downward along a y-coordinate). Also shown in FIG. 6 is a dimension $\Delta z_s$, which represents a distance of an air flow gap that exists between a vented portion (e.g., air flow grid portion) of the pivotal handle 460 and a vented portion (e.g., air flow grid portion) of the base 450.

As described herein, for an open orientation of the pivotal handle 460 with respect to the base 450, a finger insertion gap exists between the vented portion of the pivotal handle and the vented portion of the base, for example, as shown in FIG. 5 as the dimension $\Delta z_H$, which represents the distance of the finger insertion gap. Accordingly, the air flow gap dimension $\Delta z_s$ allows for a finger insert gap $\Delta z_H$ upon even a slight amount of rotation of the handle 460 about the hinge axis 442 with respect to the base 450. As described herein, upon depression of the button 470, the prong 497 may release the swing end 462 of the handle 460 where the spring 444 biases the handle 460 with respect to the base 450 to provide for rotation sufficient to create the finger insertion gap $\Delta z_H$. Further, in the example of FIG. 6, the shape of the grip 433 dictates in part the distance $\Delta z_s$, which is relatively constant over a substantial portion of the handle 460 (e.g., along the x-coordinate).

In another example (e.g., without the shaped grip 433), a top surface, a bottom surface or the top and bottom surfaces of a handle may extend inward toward a base to essentially close-off the gap (e.g., top, bottom or both top and bottom) yet leave an air flow space between the handle and the base. In such an example, air drawn in through the handle would be relatively confined and drawn through the air flow passages of the base.

In the example of FIG. 6, the method 650 includes a block 652 for drawing air through air flow passages of a handle latched to a base, a block 654 for drawing the air through air flow passages of the base, the base attached to a media drive, and a block 656 for drawing the air drawn through the air flow passages of the base across surfaces of the media drive. Where the media drive is in a stand-by or operational mode (or otherwise powered such that it generates heat), drawing the air across surfaces of the media drive can remove heat from the media drive. As mentioned, a base may include one or more bevels (e.g., beveled or angled surfaces) such as the surfaces 417 and 457. As described herein, a method can include directing air drawn through air flow passages of a handle to air flow passages of a base along at least one bevel of the base.

As described herein, an air handling unit such as the CRAC unit 109 of FIG. 1 may provide for drawing air. As described herein, a server unit may include an air mover or be mounted in a rack that includes an air mover. As described herein, a rack with media drive bays may include an air mover. As mentioned, equipment is generally configured to draw air, however, in some situations air may be forced, for example, through passages of a handle, a base and across a media drive.

Figure 7:
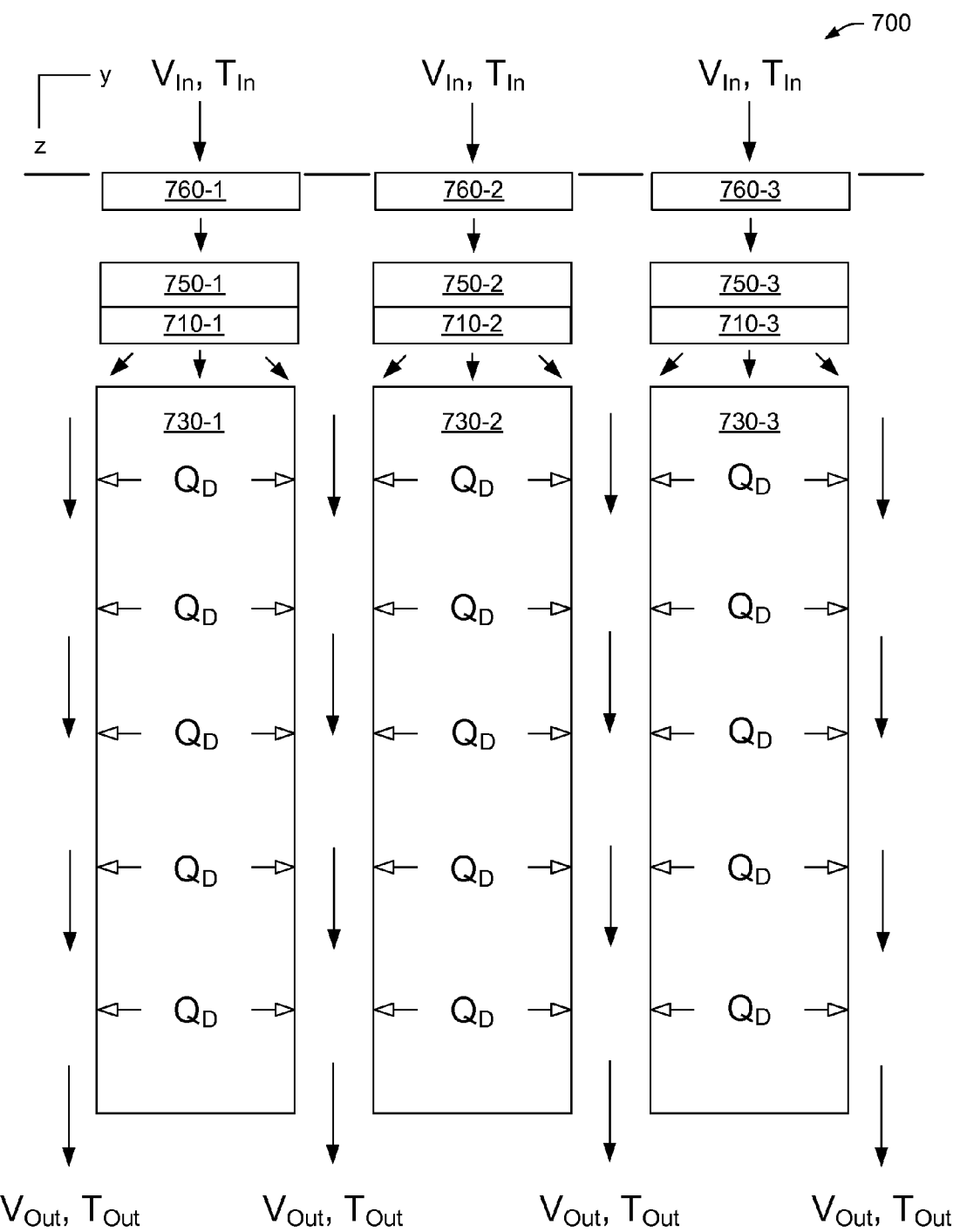
FIG. 7 is a series of views of various assemblies in a media drive bay.

FIG. 7 shows a simplified, cross-sectional diagram of a bay 700 that include multiple media drive assemblies where each assembly includes a base 750-1, 750-2, and 750-3 (e.g., such as the base 450), a handle 760-1, 760-2, and 760-3 (e.g., such as the handle 460), a tray front 710-1, 710-2, and 710-3 (e.g., such as the tray plate 310) and a media drive 730-1, 730-2, and 730-3 (e.g., such as the media drive 530). The bay 700 may optionally be configured as the bay of the server unit 113 of FIG. 1 where the assemblies represent three media drive assemblies of the media drive assemblies 123-1 to 123-8.

As shown in the example of FIG. 7, incoming air flows with a certain mass or volumetric rate, represented as "V", and with a certain amount of energy, represented as "T". The air flows through respective handles 760-1, 760-2, and 760-3, through respective bases 750-1, 750-2, and 750-3 and through respective tray plates 710-1, 710-2, and 710-3. Each assembly includes a respective gap 720-1, 720-2, and 720-3, which allows air to be distributed to one or more surfaces of the media drives 730-1, 730-2, and 730-3; noting that for adjacent media drives, a passage may be formed that provides for passage of air drawn through more than one of the handles 760-1, 760-2, and 760-3 and optionally more than one of the bases 750-1, 750-2, and 750-3 and more than one of the front plates 710-1, 710-2, and 710-3.

As described herein, an assembly can include one or more processors configured to execute instructions stored in memory; memory configured to store processor-executable instructions; a media drive configured to store information and to respond to instructions executed by at least one of the one or more processors; and a subassembly configured to carry the media drive. Such a subassembly can include a base and, attached to the base, a pivotal handle that comprises a swing end and an opposing pivot end, where for a closed orientation of the pivotal handle with respect to the base, an air flow gap exists between a vented portion of the pivotal handle and a vented portion of the base, and for an open orientation of the pivotal handle with respect to the base, a finger insertion gap exists between the vented portion of the pivotal handle and the vented portion of the base. As described herein, an assembly can include an air mover configured to draw air through a vented portion of a pivotal handle and a vented portion of a base for a closed orientation, for example, where the vented portion of the pivotal handle is approximately parallel to the vented portion of the base and where, for an open orientation, the vented portion of the pivotal handle is pivoted at an angle with respect to the vented portion of the base The term "circuit" or "circuitry" may be used herein (e.g., in the summary, description, and/or claims). As is well known in the art, the term "circuitry" includes all levels of available integration, e.g., from discrete logic circuits to the highest level of circuit integration such as VLSI, and includes programmable logic components programmed to perform the functions of an embodiment as well as general-purpose or special-purpose processors programmed with instructions to perform those functions. Such circuitry may optionally rely on one or more computer-readable media that includes computer-executable instructions. As described herein, a computer-readable medium may be a storage device (e.g., a memory card, a storage disk, etc.) and referred to as a computer-readable storage medium.

Figure 8:
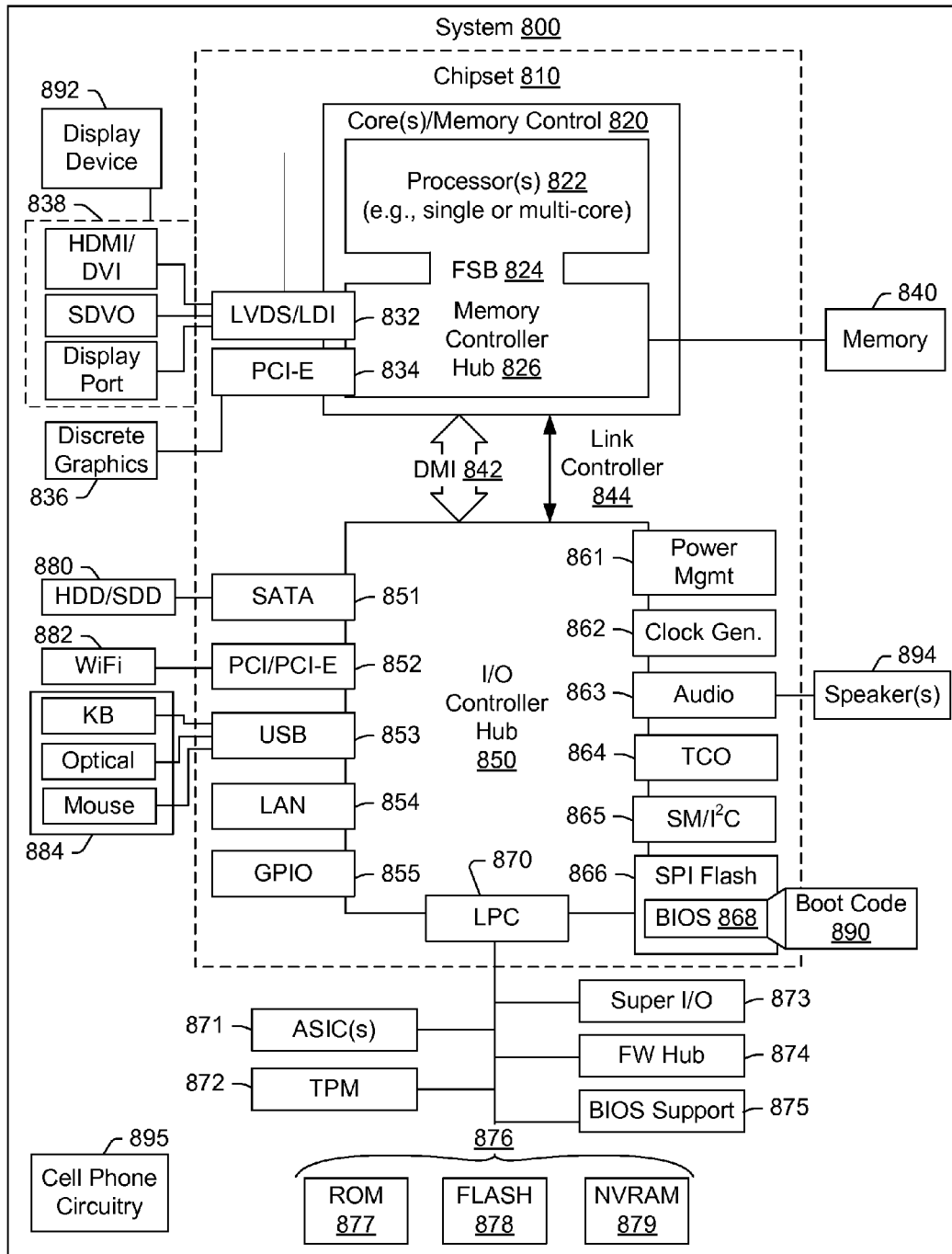
FIG. 8 is a diagram of an example of a machine.

While various examples of circuits or circuitry may be shown or discussed, FIG. 8 depicts a block diagram of an illustrative computer system 800. The system 800 may be a desktop computer system, such as one of the ThinkCentre® or ThinkPad® series of personal computers sold by Lenovo (US) Inc. of Morrisville, N.C., or a workstation computer, such as the ThinkStation® workstation computer sold by Lenovo (US) Inc. of Morrisville, N.C.; however, as apparent from the description herein, a satellite, a base, a server or other machine may include other features or only some of the features of the system 800 (e.g., consider the ThinkServer® server sold by Lenovo (US) Inc. of Morrisville, N.C.).

As shown in FIG. 8, the system 800 includes a so-called chipset 810. A chipset refers to a group of integrated circuits, or chips, that are designed to work together. Chipsets are usually marketed as a single product (e.g., consider chipsets marketed under the brands INTEL®, AMD®, etc.).

In the example of FIG. 8, the chipset 810 has a particular architecture, which may vary to some extent depending on brand or manufacturer. The architecture of the chipset 810 includes a core and memory control group 820 and an I/O controller hub 850 that exchange information (e.g., data, signals, commands, etc.) via, for example, a direct management interface or direct media interface (DMI) 842 or a link controller 844. In the example of FIG. 8, the DMI 842 is a chip-to-chip interface (sometimes referred to as being a link between a "northbridge" and a "southbridge").

The core and memory control group 820 include one or more processors 822 (e.g., single core or multi-core) and a memory controller hub 826 that exchange information via a front side bus (FSB) 824. As described herein, various components of the core and memory control group 820 may be integrated onto a single processor die, for example, to make a chip that supplants the conventional "northbridge" style architecture.

The memory controller hub 826 interfaces with memory 840. For example, the memory controller hub 826 may provide support for DDR SDRAM memory (e.g., DDR, DDR2, DDR3, etc.). In general, the memory 840 is a type of random-access memory (RAM). It is often referred to as "system memory".

The memory controller hub 826 further includes a low-voltage differential signaling interface (LVDS) 832. The LVDS 832 may be a so-called LVDS Display Interface (LDI) for support of a display device 892 (e.g., a CRT, a flat panel, a projector, etc.). A block 838 includes some examples of technologies that may be supported via the LVDS interface 832 (e.g., serial digital video, HDMI/DVI, display port). The memory controller hub 826 also includes one or more PCI-express interfaces (PCI-E) 834, for example, for support of discrete graphics 836. Discrete graphics using a PCI-E interface has become an alternative approach to an accelerated graphics port (AGP). For example, the memory controller hub 826 may include a 16-lane (x16) PCI-E port for an external PCI-E-based graphics card. A system may include AGP or PCI-E for support of graphics. As described herein, a display may be a sensor display (e.g., configured for receipt of input using a stylus, a finger, etc.). As described herein, a sensor display may rely on resistive sensing, optical sensing, or other type of sensing.

The I/O hub controller 850 includes a variety of interfaces. The example of FIG. 8 includes a SATA interface 851, one or more PCI-E interfaces 852 (optionally one or more legacy PCI interfaces), one or more USB interfaces 853, a LAN interface 854 (more generally a network interface), a general purpose I/O interface (GPIO) 855, a low-pin count (LPC) interface 870, a power management interface 861, a clock generator interface 862, an audio interface 863 (e.g., for speakers 894), a total cost of operation (TCO) interface 864, a system management bus interface (e.g., a multi-master serial computer bus interface) 865, and a serial peripheral flash memory/controller interface (SPI Flash) 866, which, in the example of FIG. 8, includes BIOS 868 and boot code 890. With respect to network connections, the I/O hub controller 850 may include integrated gigabit Ethernet controller lines multiplexed with a PCI-E interface port. Other network features may operate independent of a PCI-E interface.

The interfaces of the I/O hub controller 850 provide for communication with various devices, networks, etc. For example, the SATA interface 851 provides for reading, writing or reading and writing information on one or more drives 880 such as HDDs, SDDs or a combination thereof. The I/O hub controller 850 may also include an advanced host controller interface (AHCI) to support one or more drives 880. The PCI-E interface 852 allows for wireless connections 882 to devices, networks, etc. The USB interface 853 provides for input devices 884 such as keyboards (KB), one or more optical sensors, mice and various other devices (e.g., microphones, cameras, phones, storage, media players, etc.). On or more other types of sensors may optionally rely on the USB interface 853 or another interface (e.g., $I^2C$, etc.).

In the example of FIG. 8, the LPC interface 870 provides for use of one or more ASICs 871, a trusted platform module (TPM) 872, a super I/O 873, a firmware hub 874, BIOS support 875 as well as various types of memory 876 such as ROM 877, Flash 878, and non-volatile RAM (NVRAM) 879. With respect to the TPM 872, this module may be in the form of a chip that can be used to authenticate software and hardware devices. For example, a TPM may be capable of performing platform authentication and may be used to verify that a system seeking access is the expected system.

The system 800, upon power on, may be configured to execute boot code 890 for the BIOS 868, as stored within the SPI Flash 866, and thereafter processes data under the control of one or more operating systems and application software (e.g., stored in system memory 840). An operating system may be stored in any of a variety of locations and accessed, for example, according to instructions of the BIOS 868. Again, as described herein, a satellite, a base, a server or other machine may include fewer or more features than shown in the system 800 of FIG. 8. Further, the system 800 of FIG. 8 is shown as optionally including cell phone circuitry 895, which may include GSM, CDMA, etc., types of circuitry configured for coordinated operation with one or more of the other features of the system 800.

Conclusion

Although examples of methods, devices, systems, etc., have been described in language specific to structural features and/or methodological acts, it is to be understood that the subject matter defined in the appended claims is not necessarily limited to the specific features or acts described. Rather, the specific features and acts are disclosed as examples of forms of implementing the claimed methods, devices, systems, etc.

What is claimed is:

1. An assembly configured for attachment to a media drive, the assembly comprising:
   a handle that comprises
      a handle front side,
      a handle back side,
      a handle hinge end,
      a handle swing end,
      disposed adjacent the handle swing end, a grip that comprises bevels that join a column, and
      front side to back side handle air flow passages disposed intermediate the handle hinge end and the handle swing end; and
   a base that comprises
      a base front side,
      a base back side,
      a base hinge end,
      an opposing base end,
      a pair of front side base bevels disposed intermediate the base hinge end and the opposing base end, and
      front side to back side base air flow passages disposed intermediate the pair of front side base bevels, the base air flow passages configured to receive air flow from the handle air flow passages for a latched orientation of the handle with respect to the base.

2. The assembly of claim 1 wherein the handle back side comprises structural support ribs.

3. The assembly of claim 1 wherein, for the latched orientation, the handle air flow passages are offset from the base air flow passages to create a visual screen.

4. The assembly of claim 1 wherein the handle air flow passages comprise substantially rectangular cross-sectional areas.

5. The assembly of claim 1 wherein one of the bevels of the grip of the handle comprises a back side bevel at the handle swing end configured to seat against one of the front side base bevels.

6. The assembly of claim 5 wherein the back side bevel of the grip comprises an opening configured to receive a latch extending from the front side base bevel.

7. The assembly of claim 1 wherein the column of the grip is set inwardly from the handle swing end and extends from a handle top side to a handle bottom side, the column configured to seat against the base front side for the latched orientation.

8. The assembly of claim 7 wherein a gap exists between the column of the grip and handle air flow passages.

9. The assembly of claim 1 wherein the column comprises a triangular cross-sectional area.

10. The assembly of claim 1 wherein, for the latched orientation, the pair of front side base bevels are configured to direct air flow to the base air flow passages.

11. The assembly of claim 1 wherein the number of handle air flow passages exceeds the number of base air flow passages.

12. A method comprising:
   providing a handle that comprises a handle front side, a handle back side, a handle hinge end, a handle swing end, a grip disposed adjacent the handle swing end wherein the grip comprises bevels that join a column, and front side to back side handle air flow passages disposed intermediate the handle hinge end and the handle swing end;
   providing, attached to a media drive, a base that comprises a base front side, a base back side, a base hinge end, an opposing base end, a pair of front side base bevels disposed intermediate the base hinge end and the opposing base end, and front side to back side base air flow passages disposed intermediate the pair of front side base bevels, the base air flow passages configured to receive air flow from the handle air flow passages for a latched orientation of the handle with respect to the base;
   in the latched orientation, drawing air through the handle air flow passages;
   drawing the air through the base air flow passages; and
   drawing the air drawn through the base air flow passages across surfaces of the media drive.

13. The method of claim 12 wherein the drawing the air across surfaces of the media drive removes heat from the media drive.

14. An assembly comprising:
   one or more processors configured to execute instructions stored in memory;
   memory configured to store processor-executable instructions;
   a media drive configured to store information and to respond to instructions executed by at least one of the one or more processors; and
   a subassembly configured to carry the media drive wherein the subassembly comprises
      a handle that comprises a handle front side, a handle back side, a handle hinge end, a handle swing end, a grip disposed adjacent the handle swing end wherein the grip comprises bevels that join a column, and front side to back side handle air flow passages disposed intermediate the handle hinge end and the handle swing end, and
      a base that comprises a base front side, a base back side, a base hinge end, an opposing base end, a pair of front side base bevels disposed intermediate the base hinge end and the opposing base end, and front side to back side base air flow passages disposed intermediate the pair of front side base bevels, the base air flow passages configured to receive air flow from the handle air flow passages for a latched orientation of the handle with respect to the base.

15. The assembly of claim 14 further comprising an air mover configured to draw air through the base air flow passages.

16. An assembly configured for attachment to a media drive, the assembly comprising:
   a handle that comprises
      a handle front side,
      a handle back side,
      a handle hinge end,
      a handle swing end,
      disposed adjacent the handle swing end, a grip that comprises a column set inwardly from the handle swing end and extending from a top side to a bottom side of the handle, and
      front side to back side handle air flow passages disposed intermediate the handle hinge end and the handle swing end; and
   a base that comprises
      a base front side,
      a base back side,
      a base hinge end,
      an opposing base end,
      a pair of front side base bevels disposed intermediate the base hinge end and the opposing base end, and front side to back side base air flow passages disposed intermediate the pair of front side base bevels, the base air flow passages configured to receive air flow from the handle air flow passages for a latched orientation of the handle with respect to the base;

wherein the column of the grip is configured to seat against the base front side for the latched orientation and wherein a gap exists between the column of the grip and the handle air flow passages.

17. The assembly of claim 16 further comprising the media drive;

one or more processors configured to execute instructions stored in memory; and memory configured to store processor-executable instructions;

wherein the media drive is configured to store information and to respond to instructions executed by at least one of the one or more processors.

* * * * *